United States Patent [19]

Hopta

[11] Patent Number: 4,680,480
[45] Date of Patent: Jul. 14, 1987

[54] OUTPUT DRIVER CIRCUIT FOR LSI AND VLSI ECL CHIPS WITH AN ACTIVE PULLDOWN

[75] Inventor: Daniel F. Hopta, Bolton, Mass.

[73] Assignee: Storage Technology Corporation, Louisville, Colo.

[21] Appl. No.: 646,601

[22] Filed: Aug. 31, 1984

[51] Int. Cl.$^4$ ............... H03K 19/013; H03K 19/003; H03K 19/086; H03K 17/04
[52] U.S. Cl. ................................ 307/270; 307/310; 307/455; 307/247.1
[58] Field of Search ............... 307/443, 455, 475, 467, 307/270, 264, 247 R, 310

[56] References Cited

U.S. PATENT DOCUMENTS

| | | | |
|---|---|---|---|
| 3,660,676 | 5/1972 | Fleischhammer et al. | 307/475 |
| 3,766,406 | 10/1973 | Bryant et al. | 307/475 |
| 4,347,446 | 8/1982 | Price | 307/475 X |
| 4,456,838 | 6/1984 | Taguchi et al. | 307/475 X |
| 4,476,403 | 10/1984 | Allen | 307/475 |
| 4,490,630 | 12/1984 | Freeman | 307/270 X |
| 4,533,838 | 8/1985 | Fujita | 307/247 R X |
| 4,551,642 | 11/1985 | Aizawa et al. | 307/264 X |
| 4,565,976 | 1/1986 | Campbell | 307/455 X |

Primary Examiner—Stanley D. Miller
Assistant Examiner—David R. Bertelson
Attorney, Agent, or Firm—Woodcock Washburn Kurtz Mackiewicz & Norris

[57] ABSTRACT

An output drive circuit for LSI and VLSI ECL chips is presented. The drive circuit converts the logic levels of the ECL chip to those required by an external circuit being driven. The driver circuit includes a differential amplifier (21) having a selectable switching threshold level. One output signal line from the differential amplifier is coupled to an emitter follower output transistor (Q10) having a resistor (R17) placed in series with an output node (26). An active pulldown transistor (Q11) is connected between the output node and a negative voltage reference level. The base terminal of the pulldown transistor is driven from a current source. A capacitor (C1) is connected between the base of the pulldown transistor and the other output signal line of the differential amplifier. A temperature compensation circuit (23) causes the output signal levels appearing on the output node to track the variations in signal levels of the external circuit caused by temperature changes.

9 Claims, 2 Drawing Figures

OUTPUT DRIVER CIRCUIT FOR LSI AND VLSI ECL CHIPS WITH AN ACTIVE PULLDOWN

BACKGROUND OF THE INVENTION

This invention relates to an output driver circuit for use on large scale integration (LSI) and very large scale integration (VLSI) emitter coupled logic (ECL) circuit chips. More particularly, the invention relates to an ECL output driver circuit which converts logic levels to agree with those of the circuit being driven, is temperature compensated and has an active pulldown.

ECL logic circuits are commonly used in the prior art. FIG. 1 is a schematic diagram of one such circuit which is manufactured by Motorola Semiconductor Products, Incorporated, of Phoenix, Ariz. and is one of their Motorola Emitter Coupled Logic (MECL) line of products.

The theory of operation of ECL logic circuits is well understood in the art and will only be explained briefly here. Referring to FIG. 1, the circuit chosen for the explanation is an OR/NOR gate. The circuit has a multiplicity of inputs 10, consisting of inputs A, B and C connected to the transistors, Q1, A2 and Q3, respectively. A differential amplifier 11 is formed by the resistors R1-R3, transistor Q4 and any one or all of the transistors Q1, Q2 or Q3.

A reference circuit 12, consisting of resistors R4-R6, transistor Q5 and diodes CR1-CR2, generates a reference voltage at the emitter of transistor Q5, which is connected to the base of transistor Q4. This reference voltage establishes the switching level of the differential amplifier 11. The diodes CR1-CR2 are temperature compensating elements which cause the reference voltage to remain relatively constant with temperature changes.

When all of the inputs A, B and C are at a low logic level, the transistors Q1, Q2 and Q3 will be off and transistor Q4 will be on. The output signals of the differential amplifier 11, the voltages across resistors R1 and R2, are connected to the bases of the emitter follower outputs 13, transistors Q7 and Q6, respectively. The emitter of transistor Q6, the OR output 14, is at a low logic level and the emitter of transistor Q7, the NOR output 15, is at a high logic level.

If any of the inputs A, B or C should change to a high logic level, the state of the differential amplifier 11 will switch. That is, transistor Q4 will turn off and the transistor whose input is high, i.e., Q1, Q2 or Q3, will be turned on. This causes the OR output 14 to switch from a low logic level to a high logic level and the NOR output 15 to switch from a high logic level to a low logic level.

One of the advantages of ECL logic circuits is their fast switching speeds, that is, the time it takes the outputs 14-15 to switch from one logic level to the other. This time is on the order of a nanosecond. This means that interconnections between circuits that are only a few inches long, depending upon the switching time, will act as transmission lines. When this is the case, the transmission line must be terminated in its characteristic impedance with an external resistor to avoid signal reflections on the line.

The circuit shown in FIG. 1 is merely typical of the type of ECL circuits used in small scale integration (SSI) and medium scale integration (MSI) chips. Many variations of the circuit exist. However, the ECL circuits of the prior art did establish some "standards". These so-called standards are shown in TABLE I, below:

TABLE I

| | |
|---|---|
| OPERATING VOLTAGE | −5.20 VOLTS |
| HIGH LOGIC LEVEL | −0.85 VOLTS |
| REFERENCE VOLTAGE | −1.30 VOLTS |
| LOW LOGIC LEVEL | −1.70 VOLTS |
| LOGIC SWING | 0.85 VOLTS |
| TRANSMISSION LINE IMPEDANCE | 50 OHMS |
| TERMINATING RESISTANCE | 50 OHMS |
| TERMINATING VOLTAGE | −2 VOLTS |

As ECL technology increased to LSI and VLSI, the individual circuit elements became smaller and more circuits were used on a chip. The combination of these two factors require that the power dissipated by the circuits be decreased. This was typically done by using a lower operating voltage, a lower reference voltage and a smaller logic swing. Disadvantageously, these changes do not allow the LSI and VLSI ECL circuits to be connected directly to SSI and MSI ECL circuits. Some special driver circuit which converts the reference level and the amount of logic swing of the LSI or VLSI ECL circuit is required.

In SSI and MSI ECL, an output circuit which drives a line terminated with 50 ohms connected to −2.0 volts dissipates approximately 50 milliwatts. The transistor used as the emitter follower output must be physically large enough to source the current and dissipate the power required. Unfortunately, an LSI or VSLI chip can have tens to hundreds of outputs and if each had to drive a 50 ohm terminator, the amount of area used on the chip for the emitter follower transistors and the total power dissipated would both be unacceptable.

It is evident from the above discussion that a need exists in the art for an output driver for LSI and VLSI ECL chips that converts the voltage levels used on the chip to levels which are used by other ECL circuits and does not dissipate a large amount of power.

SUMMARY OF THE INVENTION

It is an object of this invention to provide an improved output driver circuit for use on LSI and VLSI ECL chips.

A further object of the present invention is to provide an output driver circuit that converts the logic levels of the LSI or VLSI ECL chip to the logic values expected by the circuit being driven, while providing temperature compensation so that the output signals will vary, with temperature changes, in the same manner as those of the circuit being driven.

An even further object of the present invention is to provide an output driver circuit which eliminates the need for an external terminating resistor, thereby reducing the power dissipated by the circuit.

The above and other objects of the invention are realized through the use of a differential amplifier circuit and a reference circuit. Added to this is a unique emitter follower output circuit, an output level temperature compensating circuit, an active pulldown circuit and a capacitor which couples the output of the differential amplifier to the active pulldown circuit.

The emitter follower output circuit has a resistor connected between the emitter of a first output transistor and the signal output point. A second output transistor, part of the active pulldown circuit, has its collector connected to the output point, its emitter connected to the supply voltage, and its base connected to a current mirror circuit (to cause the base to be driven by a constant current), which current mirror circuit is also part of the active pulldown circuit. The current flow through this second transistor establishes a DC operating point, thus shifting the DC level of the signal output point. This second transistor also advantageously acts as an active pulldown resistor when the emitter follower transistor (the first transistor) changes state, shifting the logic levels of the output point a desired amount.

The output level temperature compensating circuit is connected to the base of the emitter follower transistor (the first transistor). This compensating circuit adjusts the voltage at the base of the first transistor as the temperature of the chip changes. This causes the output level at the signal output point to change with temperature in the same manner as the output levels of the circuit being driven, thus making the output signal of the output driven circuit compatible, over temperature, with the circuit being driven.

The capacitor is used to speed up the switching time of the circuit. This capacitor is connected between the base of the second output transistor and the differential amplifier. When the differential amplifier changes state, the capacitor couples a pulse to the base of the second transistor (the one functioning as an active pulldown resistor). This pulse causes the second transistor to turn on more, or turn on less, depending upon the polarity of the pulse, causing the dynamic resistance of the transistor to make a momentary change, thus speeding up the change that occurs on the signal output.

The output driver circuit of the present invention advantageously eliminates the need for an external terminating resistor. This need is eliminated because during the time the output signal is switching, either the first output transistor (the emitter follower) or the second transistor (the active pulldown transistor) acts as a terminator. That is, the emitter follower transistor and its series resistor present the proper impedance during a low to high level transition. Similarly, the active pulldown transistor presents the proper impedance during a high to low level transition. The need for a larger emitter follower output transistor as used in the prior art to handle the terminating current and associated power dissipation is thus eliminated.

BRIEF DESCRIPTION OF THE DRAWINGS

The above and other objects, features, and advantages, of the present invention will become more apparent from the following description of the preferred embodiment, presented in conjunction with the following drawings, wherein.

DESCRIPTION OF THE PREFERRED EMBODIMENT

The following is a description of the best presently contemplated mode of carrying out the present invention. This description is given only to illustrate the general principles of the invention and is not to be taken in a limiting sense. To ascertain the full scope of the invention, reference should be made to the appended claims.

Figure 1:
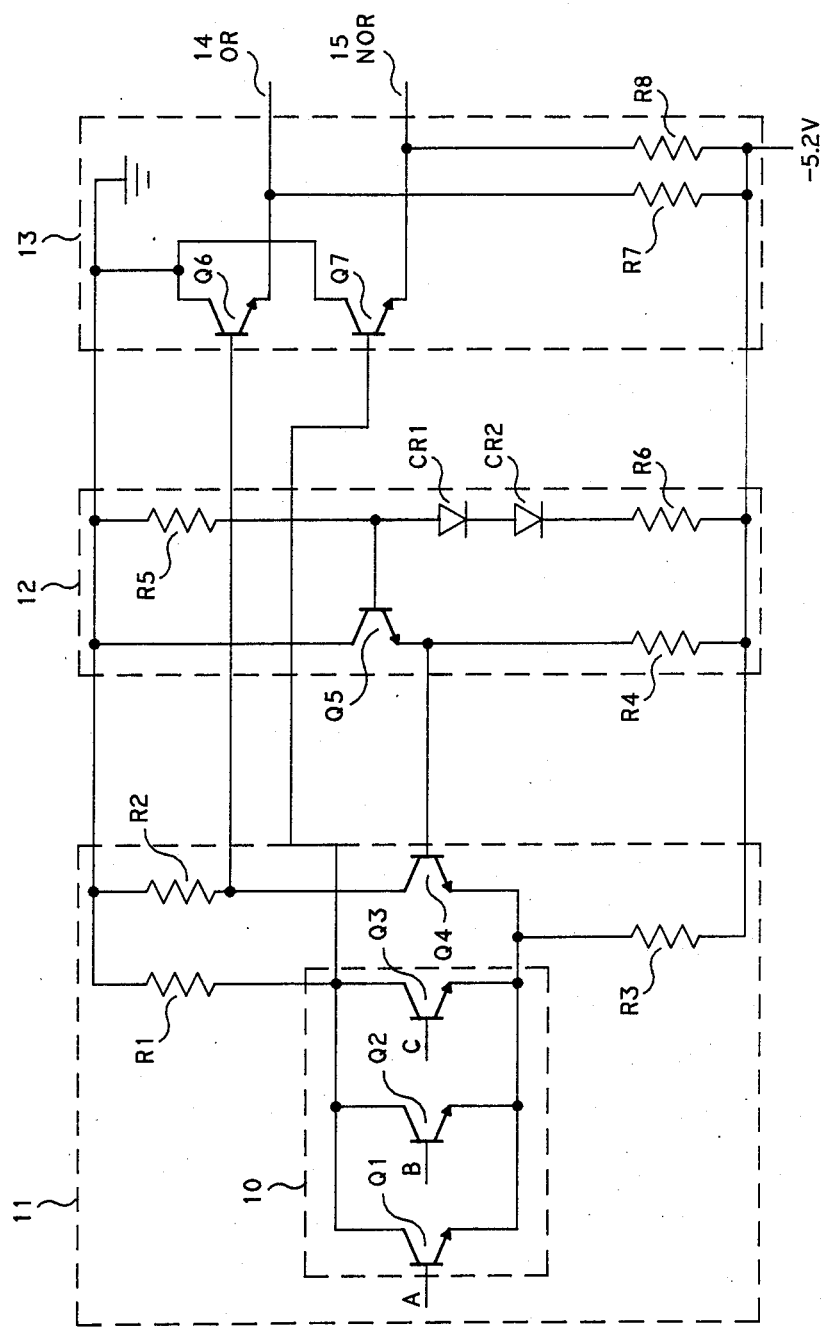
FIG. 1 is a schematic drawing of a typical ECL circuit of the prior art.

FIG. 1 was discussed previously in conjunction with the BACKGROUND OF THE INVENTION.

Figure 2:
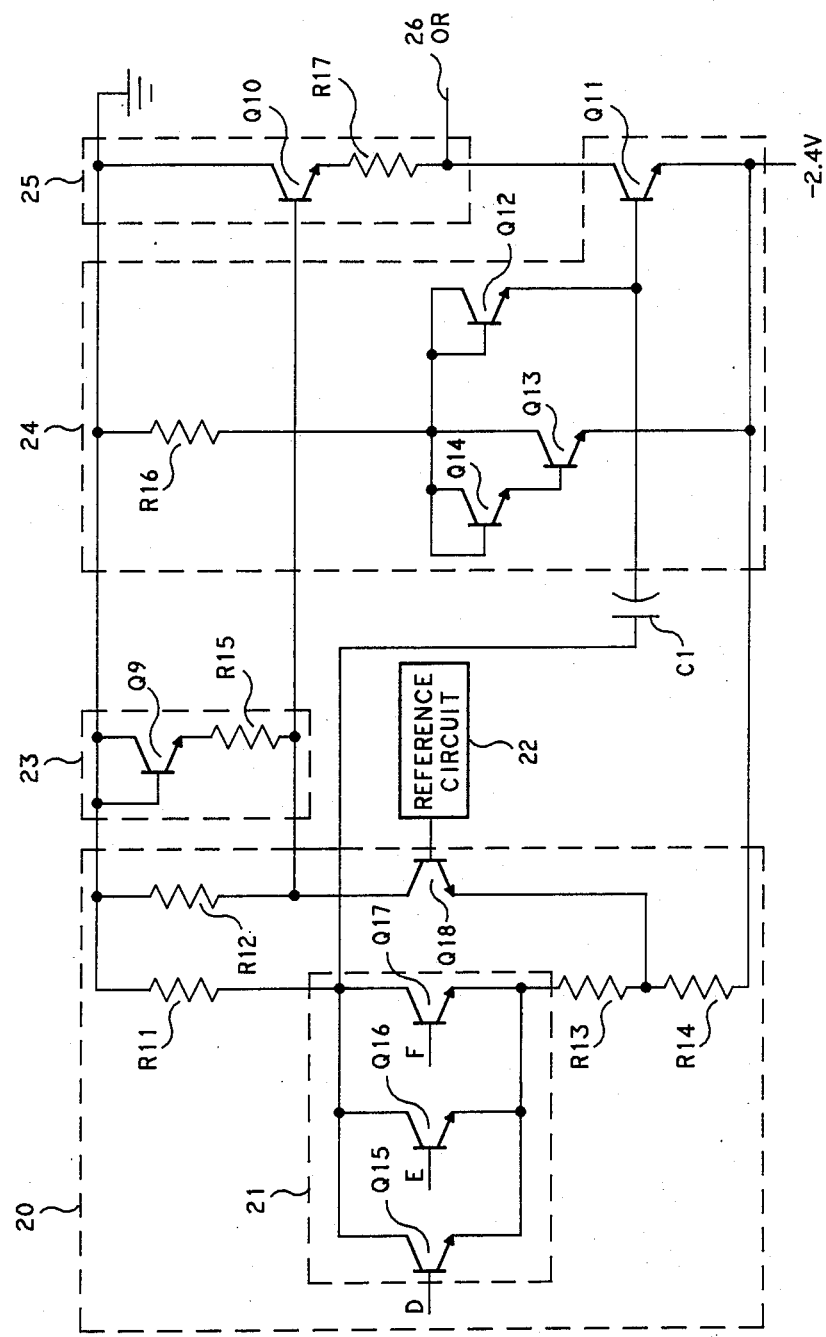
FIG. 2 includes a schematic diagram of an ECL output driver in accordance with the present invention.

FIG. 2 is a schematic drawing of an ECL circuit that uses the output driver circuit of the present invention. A three input OR gate is shown so that comparisons can be made to the three input OR/NOR circuit of FIG. 1. The NOR output portion is not shown in FIG. 2 to simplify the drawing.

Referring to FIG. 2, the multiple inputs 21 consist of the three inputs D, E and F which are connected to the bases of the transistors Q15, Q16 and Q17, respectively. The differential amplifier 20 includes resistors R11–R14, transistor Q18 and any or all of the transistors Q15–Q17. The reference circuit is illustrated in FIG. 2 as a functional block 22. This is done to both simplify the drawing and because it is not necessary that every differential amplifier have its own reference circuit. That is, in ECL circuits, whether they be SSI or LSVI, a single reference circuit, on the chip or external to the chip, can be used, if desired, to supply the reference voltage to all the differential amplifiers on the chip. This reference circuit may be of a conventional design, such as is illustrated within the dashed line 12 of FIG. 1.

It is thus apparent that the input portion of the chip of FIG. 2, including the multiple inputs 21, the differential amplifier 20 and the reference generator 22 is analogous to the prior art input portion of the circuit shown in FIG. 1. However, the output portion of the circuit of FIG. 2, including transistors Q9–Q14, resistors R15–R17 and capacitor C1, differs considerably from the emitter follower output 13 of FIG. 1. The output portion comprises the present invention and will be explained in further detail below.

As discussed in the BACKGROUND OF THE INVENTION, LSI and VLSI ECL circuits are designed to use different voltage levels in order to lower the power dissipated. The parameters of the internal circuits of a typical LSI or VLSI ECL chip of the preferred embodiment are shown in TABLE II, with the "standard" defined by SSI and MSI ECL shown in parentheses:

TABLE II

| | |
|---|---|
| OPERATING VOLTAGE | −2.40 VOLTS (−5.20 VOLTS) |
| LOW LOGIC LEVEL | −1.15 VOLTS (−1.70 VOLTS) |
| REFERENCE VOLTAGE | −0.95 VOLTS (−1.30 VOLTS) |
| HIGH LOGIC LEVEL | −0.75 VOLTS (−0.85 VOLTS) |
| LOGIC SWING | 0.40 VOLTS ( 0.85 VOLTS) |

TABLE II shows that the output of the internal circuits of the preferred embodiment could not be connected directly to the input of an SSI or MSI chip. The low logic level of the internal circuit is at all times more positive than the reference voltage of the standard and the differential amplifier of the SSI or MSI circuit would never switch, i.e., both high logic level and low logic level outputs of the internal circuit would be recognized as high logic levels by the SSI or MSI circuit. Even if the various levels of the internal circuits were "close" to the corresponding values of those of the external circuits, a conversion would be necessary to insure normal operation of the external circuits. Advantageously, the output driver circuit of the present invention converts the logic levels of the internal circuits to levels which can be recognized by the "standard" circuit.

It should be emphasized that TABLE II is for illustrative purposes only. The present invention is not restricted to the values shown nor is it restricted to interfacing with values represented by the "standard".

Referring again to FIG. 2, the output emitter follower circuit 25 comprises transistor Q10 and resistor R17, with one side of the resistor connected to the OR signal output 26. The base of transistor Q10 is connected to one output of the differential amplifier 20 at the collector of transistor Q18. The OR signal output 26 switches between low and high logic levels as the differential amplifier 20 switches.

A unique feature of the invention is the active pulldown circuit 24 comprising resistor R16 and transistors Q11–Q14. The resistor R16 and two transistors Q13–Q14 form a DC current path between ground and the −2.4 V supply voltage. The current through this path is determined by the value of resistor R16 and the base to emitter voltages (VBE) of transistors Q13–Q14. The value of the current is equal to (2.4-2 VBE)/R16 amps, or approximately 0.9/R16 amps. Thus, the value of R16 can be selected or adjusted as needed to adjust the current to a desired level.

The current flowing through R16 and Q13–Q14 will be "mirrored" by the transistors Q11–Q12 (the theory of current mirrors is well understood in the art and will not be explained here). That is, if the four transistors Q11–Q14 are all made with the same dimensions (i.e., the same size transistors), the current flowing out of the emitter of Q11, because of the current mirror, will be the same as the current out of the emitter of Q13. If transistors Q11–Q12 have dimensions that are N times larger than those of Q13–Q14, Q11's mirrored emitter current will be N times larger than Q13's.

Hence, the current flowing out of the emitter of Q11, which mirrored current establishes a DC operating point for the output signal, can be set to the desired level by adjusting the value of the resistor R16 and the relative size of transistors Q11–Q12 relative to the size of transistors Q13–Q14.

In operation, Q11 also acts as an active pulldown resistor to allow the logic levels of the internal circuits of the chip to be matched to those of the external circuits being driven. As transistor Q10 turns off, thereby presenting a low logic level output at the signal output 26, it adds less current to the mirrored collector current of transistor Q11. With less current flowing therethrough, (i.e., with the internal resistance of Q11 increasing) the emitter voltage of Q11 decreases, making the OR output more negative, thereby adding to the low logic level. The opposite occurs for a high logic level output.

The circuit being driven by the output driver circuit of the present invention has minimum and maximum values for the high and low logic levels that it can accept and still function properly. These levels are defined for both the maximum and minimum temperatures at which the external circuit is rated to operate. The output driver circuit of the present invention compensates the output signal for these values by means of the output level temperature compensation circuit 23 comprising transistor Q9 and resistor R15. As the temperature increases, the voltage drop across transistor Q9 decreases. This shifts some of the current being drawn by transistor Q18 out of resistor R12 and into resistor R15. This action causes the voltage being applied to the base of transistor Q10 (the emitter follower transistor) to decrease, thereby adjusting the output signal level for the temperature change. If the temperature decreases, the opposite effect takes place.

Still referring to FIG. 2, capacitor C1 couples the change in output of the differential amplifier 20 to the active pulldown transistor Q11 to speed up the change in the output. If any input D, E or F input signal should go to a high logic level (assuming all were previously low), the appropriate transistor Q15, Q16 or Q17, respectively, will turn on, causing the voltage across resistor R11 to increase rapidly to its final value. This rapid change in voltage is coupled by capacitor C1 as a negative pulse to the base of transistor Q11, turning Q11 off. This allows the output signal 26 to rise more rapidly than it otherwise could since its DC load is decreased during the time of the pulse.

In the opposite switching case of the differential amplifier 20, a positive pulse is coupled by capacitor C1 to the base of transistor Q11. This tends to turn Q11 on more, causing a current pulldown pulse on the collector of transistor Q11, pulling the output down more quickly.

Another advantageous feature of the driver circuit of the present invention is that it does not require an external terminating resistor. A transistor can be approximated by a model which has a parasitic resistor and a current source between the collector terminal and emitter terminal and a diode between the base terminal and emitter terminal. In the preferred embodiment, transistors Q10 and Q11 are designed to have parasitic resistances such that during a low to high logic level transition, transistor Q10 and resistor R17 present the proper terminating resistance, e.g., 50 ohms, and during a high to low logic level transition, transistor Q11 presents the proper resistance.

This is the equivalent of using a series terminator, wherein half the voltage change is dropped across the series terminator and the remainder propagates as a wavefront down the transmission line. Upon hitting the high impedance at the far end (the base of the ECL input), the wavefront doubles in amplitude and is reflected back to the source. Upon hitting the series terminator, the wavefront is absorbed. There are no further reflections, and the load is at the proper amplitude.

Advantageously, the output circuit described above only dissipates, typically, 9 milliwatts. The parameters of the circuits described above, the output level temperature compensation circuit 23, the active pulldown circuit 24 and the emitter follower output circuit 25 can be adjusted to allow the invention to be used with any external circuits that use ECL type inputs.

Further, the invention is not limited to the OR output configuration shown. The circuit of FIG. 2 could be made the equivalent of that in FIG. 1 by adding another active pulldown circuit 24', another output level temperature compensation circuit 23', another emitter follower output circuit 25', and another capacitor C1'. These additional components would be interconnected in the same manner as their counterparts shown in FIG. 2 except that the connections of capacitor C1' and the output level temperature compensation circuit 23' to the differential amplifier 20 would be interchanged. That is, capacitor C1' would be connected to the collector of transistor Q18 and the output level temperature compensation circuit would be connected to the collector of transistor Q17.

What is claimed:

1. In large scale integration (LSI) and very large scale integration (VSLI) emitter coupled logic (ECL) circuit chips, an output driver circuit for interfacing said circuit chips with external circuits that use logic levels different from said circuit chips, comprising:

a differential amplifier having a multiplicity of input signal lines and a plurality of output signal lines;

a bias circuit which establishes the switching level of said differential amplifier;

an emitter follower output circuit having an input line connected to a first output signal line of said differential amplifier;

an output level temperature compensation circuit connected to the input line of said emitter follower output circuit;

an active pulldown circuit connected to an output line of said emitter follower output circuit; and a capacitor connected between a second output of said differential amplifier and said active pulldown circuit.

2. The output drive circuit of claim 1 wherein said output level temperature compensation circuit comprises a transistor having its base and collector terminals connected to a reference voltage level and its emitter terminal connected to one end of a first resistor, the other end of said first resistor being connected to both said first output of said differential amplifier and to the input line of said emitter follower output circuit.

3. The output drive circuit of claim 1 wherein said emitter follower output circuit comprises a first transistor having its collector terminal connected to a first reference voltage level, its base terminal connected to both said first output of said differential amplifier and to said output level temperature compensation circuit, and its emitter terminal connected to one end of a first resistor, the other end of said first resistor being connected to said active pulldown circuit and to an output node for connecting to said external circuits.

4. The output driver circuit of claim 3 wherein said active pulldown circuit comprises a second transistor having a collector terminal connected to said output node, an emitter terminal connected to a second reference voltage level, said second reference voltage level having a lower potential than said first reference voltage level, and a base terminal connected to a current source having a prescribed current flowing therefrom.

5. The output driver circuit of claim 4 wherein said capacitor has one end connected to said second output of said differential amplifier, and the other end is connected to the base terminal of said second transistor.

6. An output driver circuit for use with ECL circuitry that includes a differential amplifier having a plurality of input and output signal lines, said output driver circuit comprising:

an emitter follower output circuit having an associated input signal line connected to a first output signal line of said differential amplifier;

an active pulldown circuit connected to an output signal line of said emitter follower circuit;

means for activating said active pulldown circuit whenever the output signal level of said output driver circuit is switched low, and for deactivating said active pulldown circuit whenever the output signal level of said output driver circuit is switched high and temperature compensation means connected to said emitter follower output circuit for adjusting the output signal level of said emitter follower output circuit to compensate for the effects of temperature variations appearing therein.

7. The output driver circuit of claim 6 wherein said emitter follower output circuit comprises a transistor having a resistor connected in series between the emitter of said transistor and said output signal line of said emitter follower circuit.

8. The output driver circuit of claim 6 wherein said active pulldown circuit comprises a transistor connected between said output signal line and a voltage reference level, said transistor having an input terminal thereof connected to a current source having a settable current level associated therewith.

9. The output driver circuit of claim 8 wherein said means for activating said active pulldown circuit comprises a capacitor coupled between the input terminal of said transistor and a second output signal line of said differential amplifier.

* * * * *